United States Patent
Rong

(10) Patent No.: US 11,163,546 B2
(45) Date of Patent: Nov. 2, 2021

(54) METHOD AND APPARATUS FOR SUPPORTING PROGRAMMATIC CONTROL OF A COMPILER FOR GENERATING HIGH-PERFORMANCE SPATIAL HARDWARE

(71) Applicant: Intel Corporation, Santa Clara, CA (US)

(72) Inventor: Hongbo Rong, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 792 days.

(21) Appl. No.: 15/843,333

(22) Filed: Dec. 15, 2017

(65) Prior Publication Data
US 2019/0042222 A1 Feb. 7, 2019

Related U.S. Application Data

(60) Provisional application No. 62/582,319, filed on Nov. 7, 2017.

(51) Int. Cl.
G06F 8/10 (2018.01)
G06F 8/41 (2018.01)
G06F 30/33 (2020.01)

(52) U.S. Cl.
CPC .............. *G06F 8/4435* (2013.01); *G06F 8/10* (2013.01); *G06F 8/447* (2013.01); *G06F 30/33* (2020.01)

(58) Field of Classification Search
None
See application file for complete search history.

(56) References Cited

U.S. PATENT DOCUMENTS

| | | | | |
|---|---|---|---|---|
| 10,025,643 B2* | 7/2018 | Grover | .................. | G06F 9/4843 |
| 10,289,393 B2* | 5/2019 | Gordon | .................... | G06F 8/45 |
| 2004/0068711 A1* | 4/2004 | Gupta | ..................... | G06F 30/30 |
| | | | | 716/103 |
| 2005/0188362 A1* | 8/2005 | Metzger | .................... | G06F 8/54 |
| | | | | 717/151 |
| 2008/0229028 A1* | 9/2008 | Cascaval | ............... | G06F 8/4442 |
| | | | | 711/141 |
| 2009/0187897 A1* | 7/2009 | Asao | ....................... | G06F 8/315 |
| | | | | 717/154 |
| 2010/0153934 A1* | 6/2010 | Lachner | .............. | G06F 9/30181 |
| | | | | 717/146 |
| 2011/0173596 A1* | 7/2011 | Vorbach | .............. | G06F 9/45516 |
| | | | | 717/146 |
| 2013/0194286 A1* | 8/2013 | Bourd | ....................... | G06F 9/52 |
| | | | | 345/545 |
| 2013/0222399 A1* | 8/2013 | Bourd | .................... | G06F 8/457 |
| | | | | 345/506 |

(Continued)

*Primary Examiner* — Philip Wang
*Assistant Examiner* — Rongfa P Wang

(57) ABSTRACT

A method for designing a system on a target device includes generating an intermediate representation of the system from a functional specification of a high-level description of a system. From the high-level description of the system, one or more directives are identified that (1) transform a portion of the system with a specific technique, (2) build a spatial layout for the system by dividing the system according to functionalities, and (3) specialize the system in response to the spatial layout. The intermediate representation of the system is modified in response to the one or more directives.

25 Claims, 14 Drawing Sheets

(56) References Cited

U.S. PATENT DOCUMENTS

| | | | |
|---|---|---|---|
| 2014/0040855 A1* | 2/2014 | Wang | G06F 9/4494 |
| | | | 717/107 |
| 2014/0101636 A1* | 4/2014 | Correll | G06F 8/41 |
| | | | 717/113 |
| 2014/0157218 A1* | 6/2014 | Gu | G06F 30/33 |
| | | | 716/112 |
| 2014/0304490 A1* | 10/2014 | Toyama | G06F 8/451 |
| | | | 712/30 |
| 2015/0178418 A1* | 6/2015 | Gu | G06F 30/3323 |
| | | | 716/107 |
| 2016/0267622 A1* | 9/2016 | Brothers | G06T 1/20 |
| 2019/0102338 A1* | 4/2019 | Tang | G06F 9/3802 |

\* cited by examiner

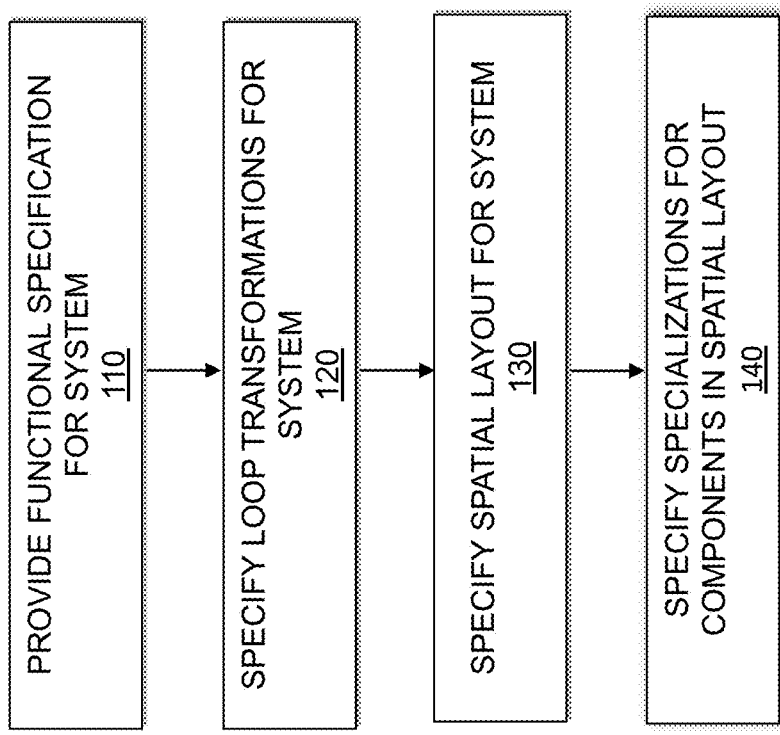

| | Notations | Semantics |
|---|---|---|
| Functional specification | Parameter p(type, {dimensions}) | A runtime parameter whose value is not known until the actual hardware runs. The parameter is a matrix (or scalar) if the dimensions is given (or not given). |
| | Assumption no_alias(A, B), symbolic_constant(N), divisible(I, II), any Boolean expression | Matrix A and B do not share any memory location. N is a symbolic constant. I is divisible by II. A Boolean expression that must be respected. |
| | Var i | Variable i. |
| | Func A, B(HOST) | Function A can a device, and function B on the host. |
| | A(i,j)= ... A.set_bounds(i, 0..I) A.set_bounds(j, 0..J) | Internally, the compiler builds a loop nest: for i = 0..I for j = 0..J A(i,j) = ... i = 0..I means i ∈ [0, I). Every loop's step is 1 by default. The output of A with the specific constant input (X, Y) need be stored to memory. Without this directive, all outputs of A will be stored. |
| | A.store(X, Y) | |
| Loop transformations | A.exchange(i, j) | Exchange two adjacent loops i and j. |
| | A.tile(i, ii, II) | Tile loop i with size of II, loop j with size of JJ, etc. The order of the loops before and after tiling is as specified in the parameters. |
| | A.tile(i, ii, jj, II, JJ) | |
| | A.unroll(i) | Fully unroll loop i. |
| | A.remove(i) | Remove loop i. |
| | A.vectorize(i) | Execute all operations inside loop i in SIMD fashion. |
| Compute partition | A.isolate_producer_chain(B, Func1, Func2, ... Funcn) | Isolate the production of a set of values of matrix B to Func1, which sends the values through Func1, ... Funcn, and finally to function A. |
| | A.isolate_consumer_chain(B, Func1, Func2, ... Funcn) | Isolate the consumption of a set of values of matrix B to Func1, which receives the values from Func1, ... Funcn, and finally from function A. |
| | A.set_min_depth(B, Func1, N) | Set the minimum depth as N for the channel that is sending B values from A to Func1. Without this, the compiler will set a conservatively big enough depth. |
| Data caching | A.buffer(I, J) [, DOUBLE|REGISTER] | Create an on-chip buffer for B, at loop level i if specified and otherwise before all the loops of function A. The buffer can be double-buffer and/or implemented in registers, at b default a single buffer implemented with on-chip memory blocks. |
| | A.linebuffer(B, i) | Similar to buffer(), except that is a line buffer. |
| | A.relay(B, <d1, d2, ...>) | In the systolic array for function A, among the incoming values of matrix B, every PE keeps those that belong to it, and forwards those that belong to the others along the direction <d1, d2, ...>. |

FIG. 2

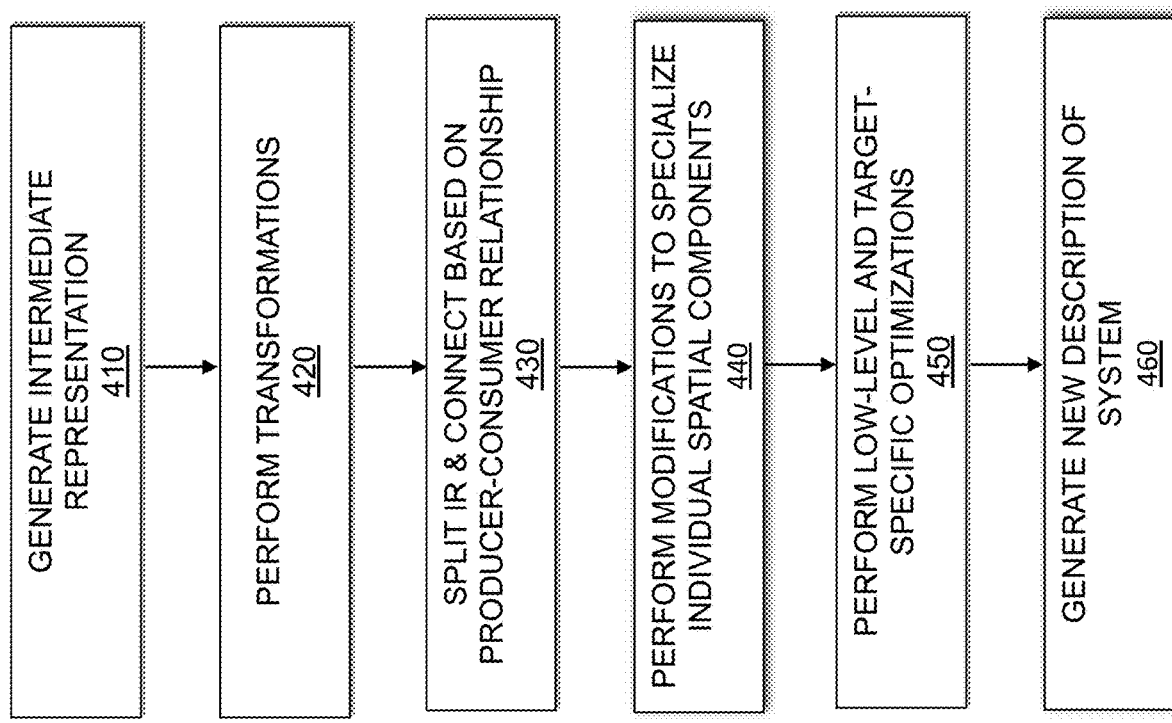

```
1  Parameter   T(int, 1), S(int, 1), I, J;
2  Assumption  no_alias(T, S), symbolic_constant(II, JJ, MAX_J),
               divisble(I, II), divisible(J, JJ), MAX_J > J;
3  Func        A, driver;
4  Var         i, j, ii, jj;
5  A(-1, -1)  = 0;
6  A(i, -1)   = 0;
7  A(-1, j)   = 0;
8  A(i, j)    = f(A(i -1, j), A(i, j - 1), A(i - 1, j - 1), T(i - 1), S(j - 1));
9  A.set_bounds(i, 0 .. I).set_bounds(j, 0 .. J).store(I - 1, J - 1);
10 A.tile(i, j, ii, jj, II, JJ);
11 A.isolate_producer_chain(S, driver)
    .isolate_producer_chain(T, driver)
    .isolate_producer_chain(A, driver)
    .isolate_consumer_chain(A, driver)
    .set_min_depth(A, driver, MAX_J);
12 A.unroll(ii, jj).relay(A, <1, 0>).relay(A, <0, 1>)
    .relay(A, <1, 1>).relay(T, <1, 0>)
    .relay(S, <0, 1>).buffer(A, j, REGISTER);
```

Functional specification (lines 1–9)

Transform loops (line 10)

Build a basic spatial layout (line 11)

Specialize A (line 12)

FIG. 5

```
for i = 0 .. I
for j = 0 .. J
    if(i == 0 && j == 0) A(-1, -1) = 0
    if(j == 0) A(i, -1) = 0
    if(i == 0) A(-1, j) = 0
    A(i, j) = f(A(i - 1, j), A(i, j - 1), A(i - 1, j - 1), T(i - 1), S(j - 1))
```

FIG. 6

```
for i = 0 .. I step II  ) Tiling
for j = 0 .. J step JJ  )
  for ii = 0 .. II
    for jj = 0 .. JJ
      i', j' = i + ii, j + jj
      if(i' == 0 && j' == 0) A(-1, -1) = 0
      if(j' == 0) A(i', -1) = 0
      if(i' == 0) A(-1, j') = 0
      A(i', j') = f(A(i' - 1, j'), A(i', j' - 1), A(i' - 1, j' - 1), A(i' - 1, j' - 1), T(i' - 1), S(j' - 1))
```

FIG. 7

METHOD AND APPARATUS FOR SUPPORTING PROGRAMMATIC CONTROL OF A COMPILER FOR GENERATING HIGH-PERFORMANCE SPATIAL HARDWARE

RELATED APPLICATION

This application claims benefit and priority to Provisional U.S. Patent Application No. 62/582,319 filed Nov. 7, 2017 entitled "Programmatic Control of a Compiler for Generating High-Performance Spatial Hardware", the full and complete subject matter of which is hereby expressly incorporated by reference in its entirety.

FIELD

Embodiments of the present disclosure relate to tools for designing systems on target devices. More specifically, embodiments of the present disclosure relate to a method and apparatus for supporting programmatic control of a compiler for generating high-performance spatial hardware.

BACKGROUND

Target devices such as field programmable gate arrays (FPGAs) and coarse grain reconfigurable architecture devices are used to implement large systems that may include million of gates and megabits of embedded memory. These target devices have a spatial architecture that includes distributed hardware resources, including arithmetic/logical elements and corresponding interconnection.

In contrast with a temporal architecture that uses a global instruction pointer to fetch instructions from memory and executes the instructions through a fixed pipeline, a spatial architecture has no instruction pointer or instructions to fetch. Instead, instructions are directly synthesized into pipelines. This specializes the programmable resources of the spatial architecture allowing it to support a specific computation, and to achieve higher power efficiency than general purpose central processing units (CPUs) and graphics processing units (GPUs). Spatial architectures may be used as special-purpose accelerators for dataflow algorithms. Dataflow algorithms are driven by data availability, which enables parallelism for high-performance.

In order to achieve high-performance, designers face the challenge of maximizing parallelism and data reuse. This may require coding or describing the system with algorithms in terms of kernels, channels, and registers to match an underlying spatial architecture. This may further require specifying low-level details which may require a large amount of time and be subject to errors.

BRIEF DESCRIPTION OF THE DRAWINGS

The features and advantages of embodiments of the present disclosure are illustrated by way of example and are not intended to limit the scope of the embodiments of the present disclosure to the particular embodiments shown.

FIG. 1 is a flow chart illustrating a method for generating a specification according to an exemplary embodiment of the present disclosure.

FIG. 2 is a table illustrating exemplary notations and semantics for directives of a specification according to an embodiment of the present disclosure.

FIG. 4 is a flow chart illustrating a method for compiling a specification according to an exemplary embodiment of the present disclosure.

FIG. 5 illustrates a specification used to describe a system according to an exemplary embodiment of the present disclosure.

FIG. 6 illustrates a loop generated from a functional specification of a specification according to an exemplary embodiment of the present disclosure.

FIG. 7 illustrates a transformed loop generated in response to a directive from a specification according to an exemplary embodiment of the present disclosure.

DETAILED DESCRIPTION

Figure 3:
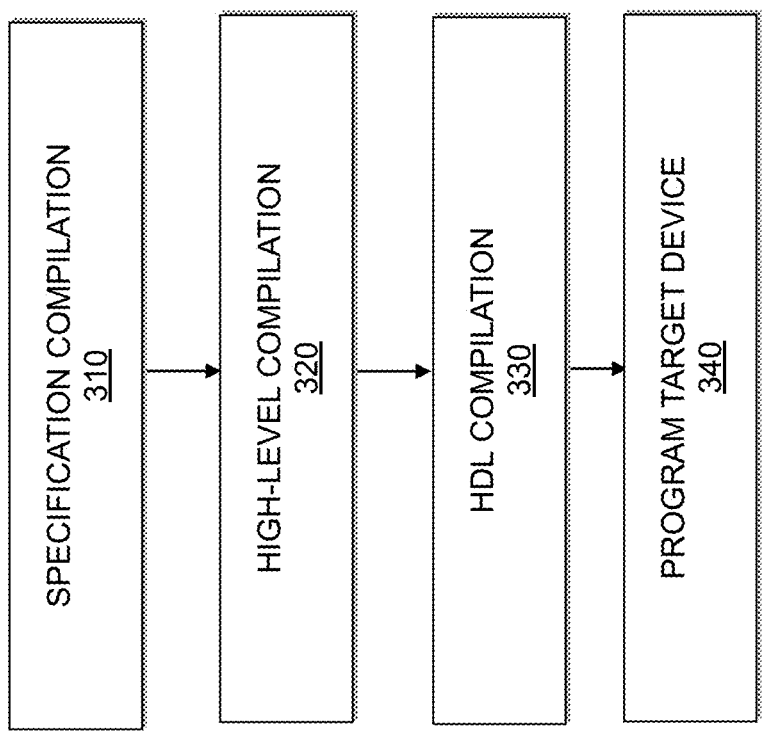
FIG. 3 is a flow chart illustrating a method for designing a system on a target device according to an exemplary embodiment of the present disclosure.

In the following description, for purposes of explanation, specific nomenclature is set forth to provide a thorough understanding of embodiments of the present disclosure. It will be apparent to one skilled in the art that specific details in the description may not be required to practice the embodiments of the present disclosure. In other instances, well-known circuits, devices, procedures, and programs are shown in block diagram form to avoid obscuring embodiments of the present disclosure unnecessarily.

Spatial architectures are efficient for executing dataflow algorithms. The challenge for designing a system on a spatial architecture, such as a target device, is that in order to achieve a high-performance design, traditional design methods may require a significant amount of time from a designer to code and verify the design. Traditional design methods provided designers with generally two options. The first option required designers to write their algorithms at the granularity of kernels, channels, and registers to match an underlying spatial architecture. Low-level details were often needed to be included which made design both timing intensive and subject to errors. The second option required designers to write simpler algorithms at a higher level of granularity and allow a compiler to automatically optimize the design. Although this approach was less timing intensive, the designer had limited control over the compiler optimizations and the design was limited to the optimizations techniques implemented by the compiler.

According to an embodiment of the present disclosure, a new programming methodology and design infrastructure is disclosed where a designer provides a specification for a design of a system that is a high-level description of the system. The high-level description of the system is at a higher level of abstraction than a high-level synthesis language. The specification describes a dataflow function and its mapping to a spatial architecture without writing the algorithm at a low-level. The specification includes directives that direct a compiler to implement the specified mapping. This methodology offers a potential advantage over traditional approaches by allowing a designer to have explicit, fine control over compiler optimizations. A designer's expertise may be expressed to achieve high-performance. High-performance in a spatial design can be specified in well-defined loop and data transformations. The designer is not required to write optimized code, but issue directives in the specification to control the compiler to generate optimized code and to ensure that transformations are legal. This reduces the time required from the designer and achieves high productivity.

FIG. 1 is a flow chart illustrating a method for generating a specification for a system to be implemented on a target device having a spatial architecture according to an exemplary embodiment of the present disclosure. The specification for the system is a high-level description of the system that is at a level higher of abstraction than a high-level synthesis language. The target device may be a field programmable gate array (FPGA), coarse grain reconfigurable architecture devices, structured application specific integrated circuit (ASIC) or other programmable device. According to one embodiment, the procedure illustrated in FIG. 1 may be performed by a designer or one or more computer aided design (CAD)/electronic design automation (EDA) tools implemented on one or more computer system.

At 110 a functional specification is provided to describe the system. According to an embodiment of the present disclosure, the functional specification identifies parameters, assumptions (including symbolic constants), variables, and a function in the system. The functional specification also defines the function and ranges of the function's parameters. The assumptions may be used for performing static optimizations and for dynamic checking for correctness. Symbolic constants from assumptions may be used for performance tuning.

At 120 loop transformations are specified for the system. According to an embodiment of the present disclosure, one or more loops in the system are identified and one or more techniques for transformation is specified for the loops. The techniques for transformation may include loop tiling, reordering, unrolling, vectorization, loop removal, and other optimization techniques. Loop removal may be used to remove redundant memory loads or stores.

At 130, a spatial layout is specified for the system. According to an embodiment of the present disclosure, a spatial layout is built by dividing the system according to functionalities. This may be achieved, for example, by isolating a producer chain and/or a consumer chain for data.

At 140, specializations for components in the spatial layout are specified. According to an embodiment of the present disclosure, specializations may be specified by performing data caching and data forwarding. Creating a user-managed data cache may be achieved by specifying a buffer at a given loop level. Creating buffers at more than one loop level allows a compiler to build a multi-level data cache hierarchy. The buffer size and read and write address functions may be specified by the compiler. Data forwarding and loop unrolling allows a compiler to construct a systolic array. Loop unrolling creates a set of processing elements, and data forwarding connects the processing elements by allowing a processing element send data to another processing element.

FIG. 2 is a table illustrating exemplary notations and semantics for a specification according to an embodiment of the present disclosure. The exemplary directives for the specification include functional specification, loop transformation, partition computation, and data caching. Each directive is listed with examples provided for illustration.

FIG. 3 is a flow chart illustrating a method for designing a system on a target device having a spatial architecture according to an exemplary embodiment of the present disclosure. The target device may be a field programmable gate array (FPGA), coarse grain reconfigurable architecture devices, structured application specific integrated circuit (ASIC) or other programmable device. According to one embodiment, the procedure illustrated in FIG. 3 may be performed by one or more computer aided design (CAD)/electronic design automation (EDA) tools, simulators, and testers implemented on one or more computer system, and/or target devices.

At 310, a specification of a design for a system is compiled. As described with reference to FIGS. 1 and 2, the specification is a high-level description of the system at a higher level of abstraction than a high-level synthesis language. According to an embodiment of the present disclosure, the specification describes one or more dataflow functions. The dataflow functions may include one or more sequential loop nest. Compilation of the specification may involve performing transformations, building a spatial layout for the system, and modifying the system in response to directives provided in the specification. Compilation also involves generating a new description of the system in a computer language description such as a high-level synthesis language, hardware description language, or other format.

At 320, high-level compilation (or "high-level design compilation"/"high-level synthesis compilation") of a design for a system is performed. According to an embodiment of the present disclosure, high-level compilation interprets a description of the system, which may be an algorithmic description of a desired behavior written in a computer language description, and generates a digital hardware description that implements the behavior. The computer language description may be a high-level description written in a serial computer language such as C, C++, or other serial computer language or high-level synthesis language. According to an embodiment of the present disclosure, the computer language description of the system may be that generated by specification compilation 310. The computer language description may be analyzed, architecturally constrained, and scheduled to create a register transfer level (RTL) HDL of the system. The HDL of the system may integrate information regarding other components or hosts that may be pre-designed.

At 330, HDL compilation is performed. HDL compilation involves performing synthesis, placement, routing, and timing analysis on the HDL of the system onto a designated target device and generating a program ("configuration") file for the target device.

At 340, the target device is programmed using the program file to implement the system. According to an embodiment of the present disclosure, the program file may be generated and transmitted to another computer system that may be used to program the target device according to the system design. By programming the target with the program file, components on the target device are physically transformed to implement the system.

The specification may be used to describe a system implementing an algorithm or function having one or more sequential loop nest. It should be appreciated that the specification may also be used to describe a system implementing algorithms, functions, features, and components other than those having a sequential loop nest. According to an embodiment of the present disclosure, a specification may be used to describe an entire system including a portion implementing an algorithm or function having a sequential loop nests as well as other portions implementing other algorithms, functions, features, or components that may not include sequential loop nests. This specification may be compiled at 310.

According to an alternate embodiment of the present disclosure, the specification may describe a portion of a system that includes an algorithm or function having a sequential loop nest where the specification is compiled at 310. A different type of description may be used to describe other portions of the system that do not have a sequential loop nest. The description may be a high-level synthesis language, HDL, or other description. In this embodiment, the specification compiled at 310 may be transformed into a description similar to that used to describe the other portions of the system. The descriptions of the portions may be combined and compiled together using high-level compilation 320 and/or HDL compilation 330.

FIG. 4 is a flow chart illustrating a method for compiling a specification according to an exemplary embodiment of the present disclosure. According to an embodiment of the present disclosure, the procedures shown in FIG. 4 may be used to implement procedure 310 in part (shown in FIG. 3).

At 410, an intermediate representation (IR) of a system is generated from a functional specification of the specification. According to an embodiment of the present disclosure, the functional specification is read sequentially and transformed into an abstract syntax tree.

At 420, transformations are performed. According to an embodiment of the present disclosure, loops described in the intermediate representation are transformed according to loop transformation directives in the specification. The loop transformations performed may include loop tiling, reordering, unrolling, vectorization, loop removal, and other loop transformation techniques. The transformations generate one or more optimized loop nests.

At 430, a spatial layout is built. According to an embodiment of the present disclosure, a spatial layout is built according to compute partitioning directives in the specification. The compute partitioning directives may partition producers or consumers of data by splitting the intermediate representation of the system into a plurality of connected components based on a producer-consumer relationship. The production or consumption of data may be assigned into separate kernels. According to exemplary embodiment, a connection between components may be implemented by a FIFO, registers, or memory channel.

At 440, modifications are performed to specialize individual spatial components for performing computations. The modifications may include adding procedures and components to perform data caching and data forwarding, and performing further loop transformations according to directives in the specification. According to an embodiment of the present disclosure, when loop unrolling is instructed by a directive, multiple copies of an intermediate representation of the system are created. A unique identifier is assigned to each copy and unique loop variables are assigned with the identifier. If an input/output channel for the intermediate representation of a channel exists prior to unrolling, the input/output channel is split into multiple channels that are all connected to a same source/destination. When a source/destination is unrolled, corresponding channels are further split and assigned to the appropriate producer and consumer.

It should be appreciated that static verification may be performed during specification compilation. Static verification confirms that the semantics of the functional specification is equivalent to that of the final intermediate representation of the system after performing transformations 420, building a spatial layout 430, and performing modifications 440.

At 450 low-level optimizations and target-specific optimizations are performed. According to an embodiment of the present disclosure, the low-level optimizations and target-specific optimizations may be performed independent of directives in a specification for the system. For example, software pipelining a loop, infinitization of a loop, reduction in a depth of a channel, removal of redundant code, removal of dead code, strength reduction, and other optimizations may be performed.

At 460, a new description of the system is generated. According to an embodiment of the present disclosure, the intermediate representation of the system is transformed to a different format such as a high-level synthesis language, a hardware description language, or other format. This new format represents a spatial hardware image for the system.

FIG. 5 illustrates a specification used to describe a system according to an exemplary embodiment of the present disclosure. The system performs a Smith-Waterman computation where two bio-sequences are compared and each data point is computed using 3 neighbor data points. The specification includes twelve lines of description. Lines 1-9 of the specification includes a functional specification. The functional specification includes directives for a compiler to build an intermediate representation for a loop nest. A symbolic constant MAX_J is defined for a maximum possible value for J. In further lines in the specification, the compiler is instructed to use MAX_J to set a minimum depth of register channels. The last value A is indicated to be of value where other values of A need not be stored.

FIG. 6 illustrates an exemplary sequential loop nest generated by a compiler in response to directives from lines 1-9 of the functional specification illustrated in FIG. 5.

Referring back to FIG. 5, line 10 of the specification includes a directive for a loop transformation. The directive instructs the compiler to tile the sequential loop nest.

FIG. 7 illustrates an exemplary loop nest that has been transformed according to a directive in line 10 of the specification of the system illustrated in FIG. 5. As shown, two inner loops compare a pair of fixed-sized sub-sequences. Two outer loops enumerate the pairs of fixed-sized sub-sequences. As will be described, the two inner loops can be unrolled in a subsequent optimization. Tiling followed by unrolling may be implemented as a strategy to decompose a large problem into smaller sub-problems to be solved using available hardware resources on a target device.

Referring back to FIG. 5, line 11 of the specification includes a directive to build a basic spatial layout. The directive instructs the compiler to isolate a driver function as a producer of variables S and T, and as a producer and consumer of variable A.

Figure 8:
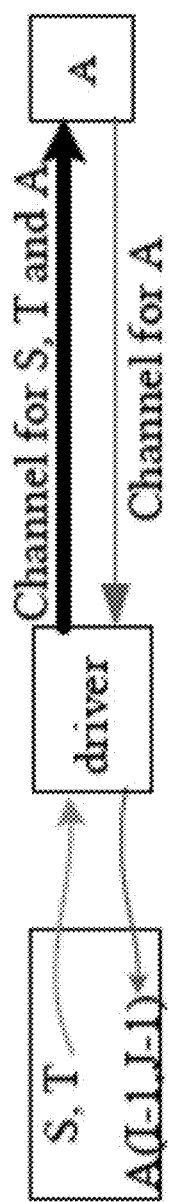
FIG. 8 illustrates a basic spatial layout of a system generated in response to a directive from a specification according to an exemplary embodiment of the present disclosure.

FIG. 8 illustrates an exemplary basic spatial layout of the system generated by a compiler in response to a directive from line 11 of the specification of the system illustrated in FIG. 5.

Referring back to FIG. 5, line 12 of the specification includes a directive to specialize components in a spatial layout for a specialized computation. The directive specializes function A by instructing the two inner loops to be unrolled. The data are forwarded in three directions. The unrolled inner loops with data forwarding forms a systolic array. The directive also instructs the compiler to create a register buffer for A values at loop level j. This loop j encloses the two innermost loops that form the systolic array. The buffer should be large enough to provide all input A values for an execution of the systolic array. All input values are redirected to this buffer in order for them to be directed to the appropriate processing elements.

Figure 9:
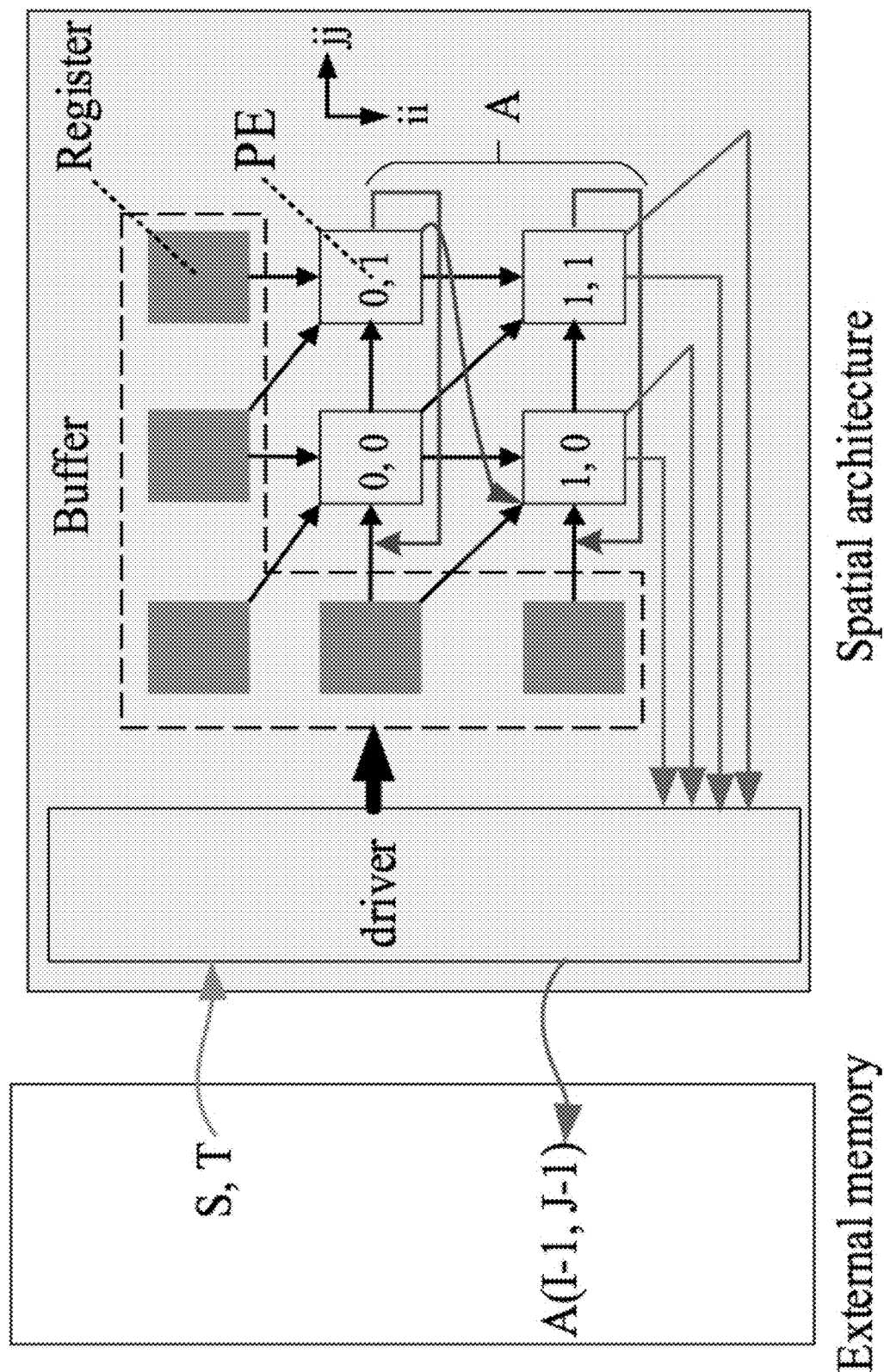
FIG. 9 illustrates a spatial architecture of a system generated in response to a directive from a specification according to an exemplary embodiment of the present disclosure.

FIG. 9 illustrates an exemplary spatial layout of the system generated by a compiler in response to the specification of the system illustrated in FIG. 5. As shown in FIG. 9, by unrolling the two innermost loops, processing elements (PEs) are created. Each PE has a unique identifier annotated that corresponds to an unrolled ii and jj loop value. The two channels originally connected with function A are split by the compiler to connect with the PEs of function A. According to the directive for data forwarding, data is forwarded among the PEs in three directions, vertically, horizontally, and diagonally. If a value is entering the systolic array from outside, it is from a producer transmitted via a driver. If a value is exiting the systolic array, it is transmitted to a consumer via the driver.

Figure 10:
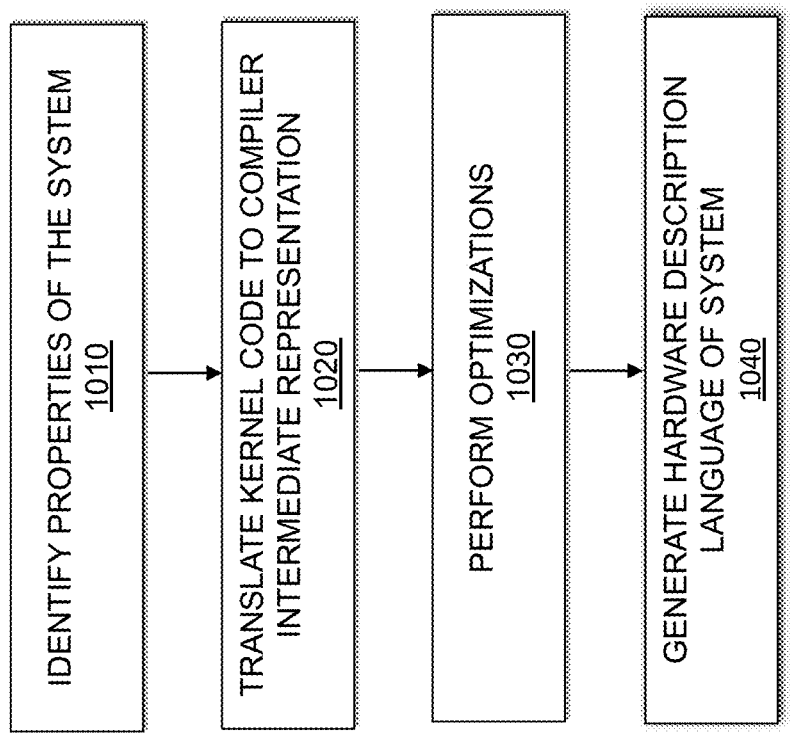
FIG. 10 is a flow chart illustrating a method for performing high-level compilation according to an exemplary embodiment of the present disclosure.

It should be appreciated that the compiler connects the PEs to the appropriate channels and transmits the appropriate data streams through the appropriate channels. The compiler also determines a depth of the channels FIG. 10 is a flow chart illustrating a method for performing high-level compilation of a system according to an embodiment of the present disclosure. According to an embodiment of the present disclosure, the procedures shown in FIG. 10 may be used to implement procedure 320 in part (shown in FIG. 3). At 1010, properties of the system are identified. According to an embodiment of the present disclosure, the properties of the system may include functions and algorithms performed by the system by one or more compute devices, and may be identified from a computer language description of the system provided by a designer. The computer language description of the system may be, for example, a high-level language such as C, C++ or another computer language description format that provides a framework for writing programs that execute across heterogeneous platforms. The computer language description format may be used for writing kernels and application programming interfaces (APIs) that are used to define and control platforms. According to an embodiment of the present disclosure, the properties of the system may be referred to as kernel code.

At 1020, the kernel code is translated to compiler intermediate representation. According to an embodiment of the present disclosure, the compiler intermediate representation of the kernel code includes a sequence of functions. Each function is a sequence of instructions grouped into basic blocks. A basic block is a contiguous sequence of instructions with one entry point and one exit point. An instruction in the middle of a basic block may be a function call, but may not count as an exit point from the basic block. Each basic block terminates with either (1) branch (possibly conditional), or (2) a return from the function. The kernel code may also include a system description of the hardware target system which it is to be implemented on.

At 1030, the compiler intermediate representation is optimized according to properties of the platform for the system. The platform for the system may include components and hosts that interface with the system.

At 1040, HDL is generated for the design of the system. The HDL describes the operation of the system to be programmed on the target device. The HDL description provides representations of a circuit in terms of the flow of signals (or transfer of data) between hardware registers, and the logic operations performed on those signals.

Figure 11:
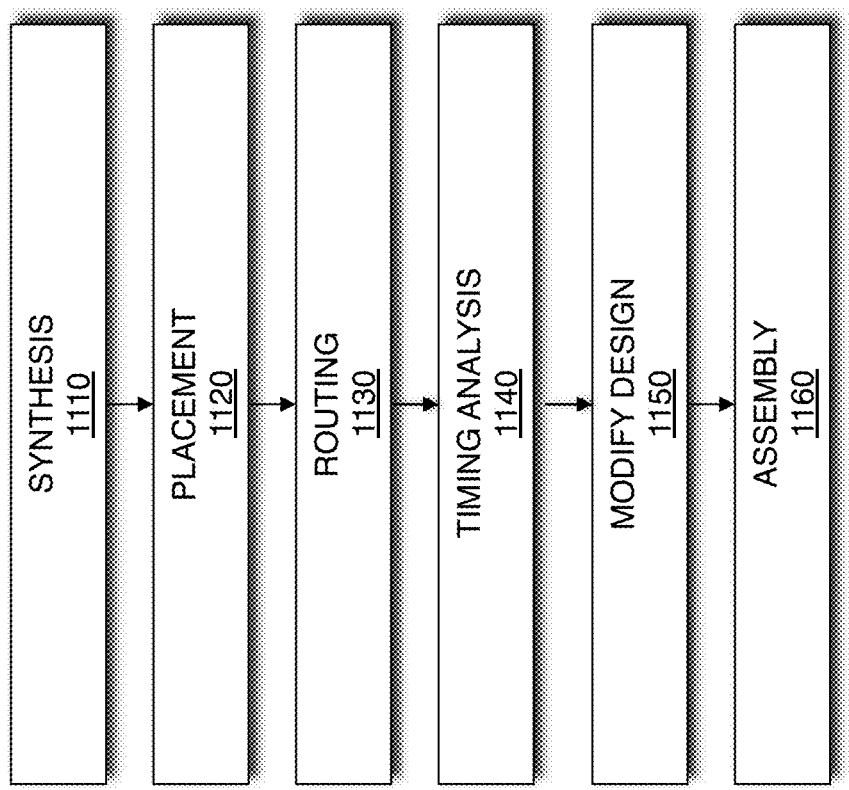
FIG. 11 is a flow chart illustrating a method for performing hardware description language compilation according to an exemplary embodiment of the present disclosure.

FIG. 11 is a flow chart illustrating a method for performing hardware description language compilation according to an exemplary embodiment of the present disclosure. According to an embodiment of the present disclosure, the procedures illustrated in FIG. 11 may be used to implement procedure 330 (shown in FIG. 3). At 1110, the system is synthesized. Synthesis includes generating a logic design of the system to be implemented by the target device. According to an embodiment of the present disclosure, synthesis generates an optimized logical representation of the system from an HDL design definition. Synthesis also includes mapping the optimized logic design. Mapping includes determining how to implement logic gates and logic elements in the optimized logic representation with specific resources on the target device such as logic elements and functional blocks. According to an embodiment of the present disclosure, a netlist is generated from mapping. This netlist may be an optimized technology-mapped netlist generated from the HDL.

At 1120, the system is placed. According to an embodiment of the present disclosure, placement involves placing the mapped logical system design on the target device. Placement works on the technology-mapped netlist to produce a placement for each of the logic elements and functional blocks. According to an embodiment of the present disclosure, placement includes fitting the system on the target device by determining which resources on the target device are to be used to implement the logic elements and functional blocks identified during synthesis. Placement may include clustering which involves grouping logic elements together to form the logic clusters present on the target device. According to an embodiment of the present disclosure, clustering is performed at an early stage of placement and occurs directly after synthesis during the placement preparation stage.

At 1130, the placed design is routed. During routing, routing resources on the target device are allocated to provide interconnections between logic gates, logic elements, and other components on the target device. Routability optimization may also be performed on the placed logic design. According to an embodiment of the present disclosure, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 1140, timing analysis is performed on the system designed by procedures 1110, 1120, and 1130. According to an embodiment of the present disclosure, the timing analysis determines whether timing constraints of the system are satisfied.

At 1150, the system is modified. According to an embodiment of the present disclosure, the system may be optionally modified in response to the results from timing analysis. Modification of the system may include performing any one or more of the synthesis 1110, placement 1120, routing 1130, and timing analysis 1140 again or in an iterative manner.

At 1160, an assembly procedure is performed. The assembly procedure involves creating a program file that includes information determined by the procedures described at 1110, 1120, 1130, 1140, and 1150. The program file may be a bit stream that may be used to program a target device. According to an embodiment of the present disclosure, the procedures illustrated in FIG. 11 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium. The target device may be programmed with the data file. By programming the target with the data file, components on the target device are physically transformed to implement the system.

FIGS. 1, 3-4, and 10-11 are flow charts that illustrate embodiments of the present disclosure. The procedures described in these figures may be performed by one or more EDA tools implemented by one or more computer systems. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques.

Figure 12:
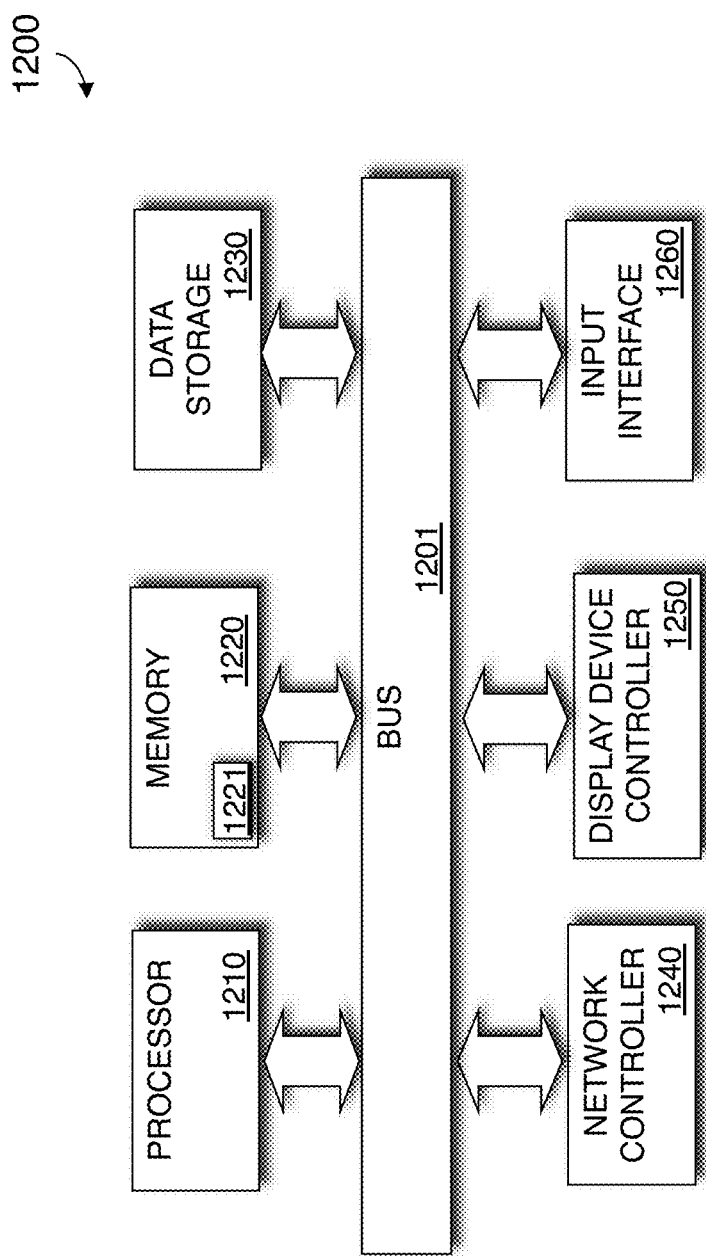
FIG. 12 is a block diagram of a computer system implementing a system designer according to an exemplary embodiment of the present disclosure.

FIG. 12 is a block diagram of an exemplary computer system 1200 in which an example embodiment of the present disclosure resides. The computer system 1200 includes a processor 1210 that process data signals. The processor 1210 is coupled to a bus 1201 or other switch fabric that transmits data signals between processor 1210 and other components in the computer system 1200. The computer system 1200 includes a memory 1220. The memory 1220 may store instructions and code represented by data signals that may be executed by the processor 1210. A data storage device 1230 is also coupled to the bus 1201.

A network controller 1240 is coupled to the bus 1201. The network controller 1240 may link the computer system 1200 to a network of computers (not shown) and supports communication among the machines. A display device controller 1250 is coupled to the bus 1201. The display device controller 1250 allows coupling of a display device (not shown) to the computer system 1200 and acts as an interface between the display device and the computer system 1200. An input interface 1260 is coupled to the bus 1201. The input interface 1260 allows coupling of an input device (not shown) to the computer system 1200 and transmits data signals from the input device to the computer system 1200.

A system designer 1221 may reside in the memory 1220 and be executed by the processor 1210. The system designer 1221 may operate to allow a designer to input a description of a system to be implemented on a target device that has a spatial architecture. The description of the design may be in the format of a specification, as described with reference to FIGS. 1 and 2, a high-level synthesis language, HDL, or other format. The system designer 1221 may also perform specification compilation, high-level compilation, HDL compilation, and/or program a target device. According to an embodiment of the present disclosure, the system designer 1221 may implement the procedures described with reference to FIGS. 1-11.

Figure 13:
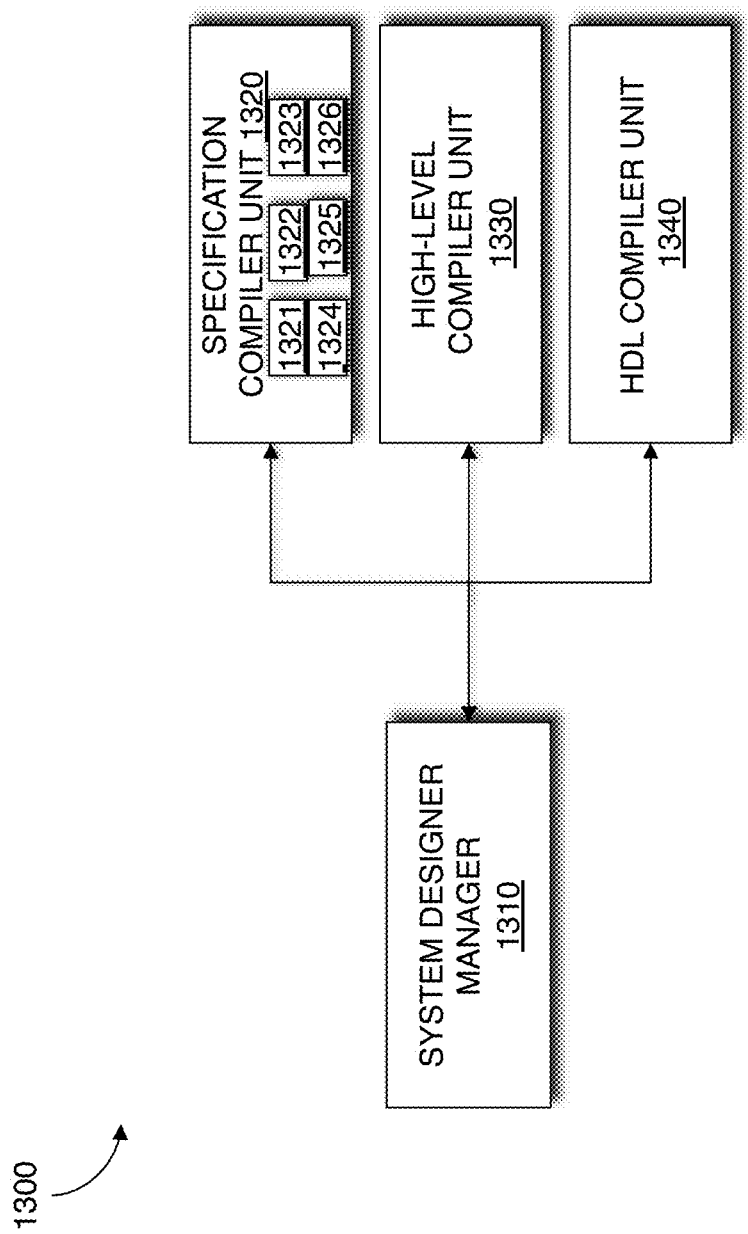
FIG. 13 is a block diagram of a system designer according to an exemplary embodiment of the present disclosure.

FIG. 13 illustrates a system designer 1300 according to an embodiment of the present disclosure. The system designer 1300 may be an EDA tool for designing a system on a target device such as an FPGA, structured application-specific integrated circuit (ASIC), ASIC, or other circuitry. FIG. 13 illustrates modules implementing an embodiment of the system designer 1300. According to one embodiment, the modules represent software modules and system design may be performed by one or more computer systems such as the one illustrated in FIG. 12 executing sequences of instructions represented by the modules shown in FIG. 13. Execution of the sequences of instructions causes the computer system to support system design as will be described hereafter. In alternate embodiments, hard-wire circuitry may be used in place of or in combination with software instructions to implement embodiments of present disclosure. Thus, embodiments of present disclosure are not limited to any specific combination of hardware circuitry and software.

The system designer 1300 includes a system designer manager 1310. The system designer manager 1310 is connected to and transmits data between the components of the system designer 1300. The system designer manager 1310 may provide an interface for a designer to input a description of a system to be implemented on a target device that has a spatial architecture. The description may be in the format of a specification, high-level synthesis language, HDL, and/or other format or a combination of formats.

The system designer 1300 includes a specification compiler unit 1320. The specification compiler unit 1320 compiles a design for a system in a specification format according to directives provided in the specification. It should be appreciated that the specification compiler unit 1320 may perform the compilation procedures described with reference to FIGS. 3-9.

The specification compiler unit 1320 includes an intermediate representation (IR) unit 1321 that generates an intermediate representation of the system from a functional specification of the specification. According to an embodiment of the present disclosure, the functional specification is read sequentially and transformed into an abstract syntax tree.

The specification compiler unit 1320 includes a transformations unit 1322 that performs transformations on the system. According to an embodiment of the present disclosure, loops described in the intermediate representation are transformed according to loop transformation directives in the specification. The loop transformations performed may include loop tiling, reordering, unrolling, vectorization, loop removal, and other loop transformation procedures. The transformations generate one or more optimized loop nests.

The specification compiler unit 1320 includes a spatial layout unit 1323 that builds a spatial layout for the system according to partitioning directives in the specification. The partitioning directives may partition producers or consumers of data by splitting the intermediate representation of the system into a plurality of connected components based on a producer-consumer relationship. The production or consumption of data may be assigned into separate kernels. According to exemplary embodiment, a connection between components may be implemented by a FIFO, register, or memory channel.

The specification compiler unit 1320 includes a specialization unit 1324 that makes modifications to the system according to directives in the specification to specialize individual spatial components for performing computations. The modifications may include adding procedures and components to perform data caching and data forwarding, and performing further loop transformations according to directives in the specification. According to an embodiment of the present disclosure, when loop unrolling is instructed by a directive, multiple copies of an intermediate representation of the system are created. A unique identifier is assigned to each copy and unique loop variables are assigned with the identifier. If an input/output channel for the intermediate representation of a channel exists prior to unrolling, the input/output channel is split into multiple channels that are all connected to a same source/destination. When a source/destination is unrolled, corresponding channels are further split and assigned to the appropriate producer and consumer.

The specification compiler unit 1320 includes a target specific optimization unit 1325 that performs low-level optimizations and target specific optimizations independent of directives in the specification for the system. For example, software pipelining a loop, infinitization of a loop, reduction in a depth of a channel, removal of redundant code, removal of dead code, strength reduction, and other optimizations may be performed.

The specification compiler unit 1320 includes a description generation unit 1326 that generates a new description of the system. According to an embodiment of the present disclosure, the intermediate representation of the system is transformed to a different format such as a high-level synthesis language, a hardware description language, or other format. This new format represents a spatial hardware image for the system.

The system designer 1300 includes a high-level design compiler (HLC) unit 1330. The high-level compiler unit 1330 interprets a description of the system, which may be an algorithmic description of a desired behavior written in a high-level synthesis language such as a computer language description, and generates a digital hardware description that implements the behavior. The computer language description may be a high-level description written in a serial computer language such as C, C++, or other computer language. The computer language description may be analyzed, architecturally constrained, and scheduled to create a register transfer level (RTL) HDL of the system. The HDL of the system may integrate information regarding other components or hosts that may be pre-designed. According to an embodiment of the present disclosure, the high-level compilation unit 1330 may perform procedures described with reference to FIGS. 3 and 10.

The system designer 1300 includes a hardware description language (HDL) compilation unit 1340. The hardware description language compilation unit 1340 performs synthesis, placement, routing, and timing analysis on the HDL of the system and generates a program file. According to an embodiment of the present disclosure, the hardware description language compilation unit 1340 may perform procedures described with reference to FIGS. 3 and 11.

The specification may be used to describe a system implementing an algorithm or function having one or more sequential loop nest. It should be appreciated that the specification may also be used to describe a system implementing algorithms, functions, features, and components other than those having a sequential loop nest. According to an embodiment of the present disclosure, a specification may be used to describe an entire system including a portion implementing an algorithm or function having a sequential loop nests as well as other portions implementing other algorithms, functions, features, or components that may not include sequential loop nests. This specification may be compiled by the specification compiler unit 1320.

According to an alternate embodiment of the present disclosure, the specification may describe a portion of a system that includes an algorithm or function having a sequential loop nest where the specification is compiled by the specification compiler unit 1320. A different type of description may be used to describe other portions of the system. The description may be a high-level synthesis language, HDL, or other description. In this embodiment, the specification compiled by the specification compiler unit 1320 may be transformed into a description similar to that used to describe the other portions of the system. The descriptions of the portions may be combined and compiled together using the high-level compiler unit 1330 and/or HDL compiler unit 1340.

It should be appreciated that embodiments of the present disclosure may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 14:
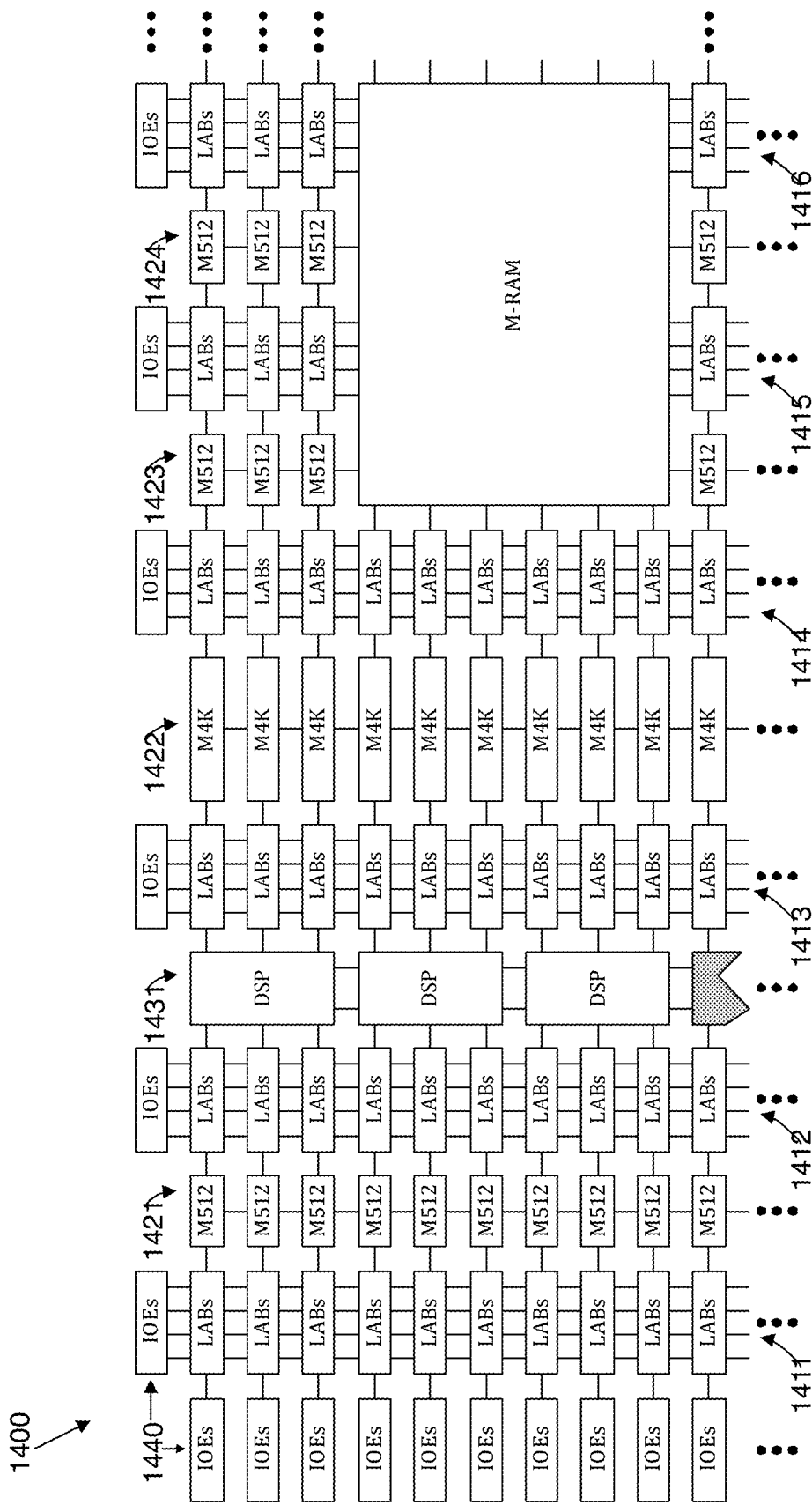
FIG. 14 illustrates an exemplary target device according to an exemplary embodiment of the present disclosure.

FIG. 14 illustrates a device 1400 that may be used to implement a target device according to an embodiment of the present disclosure. The device 1400 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present disclosure, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present disclosure, the logic block may operate similarly to an adaptive logic module (ALM), such as those found in Stratix devices manufactured by Altera Corporation. LABs are grouped into rows and columns across the device 1400. Columns of LABs are shown as 1411-1416. It should be appreciated that the logic block may include additional or alternate components.

The device 1400 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1400. Columns of memory blocks are shown as 1421-1424.

The device 1400 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 1400 and are shown as 1431.

The device 1400 includes a plurality of input/output elements (IOEs) 1440. Each IOE feeds an IO pin (not shown) on the device 1400. The IOEs 1440 are located at the end of LAB rows and columns around the periphery of the device 1400. Each IOE may include a bidirectional IO buffer and a plurality of registers for registering input, output, and output-enable signals.

The device 1400 may include routing resources such as LAB local interconnect lines, row interconnect lines ("H-type wires"), and column interconnect lines ("V-type wires") (not shown) to route signals between components on the target device.

The following examples pertain to further embodiments. In one embodiment, a method for designing a system on a target device includes generating an intermediate representation of the system from a functional specification of a high-level description of a system. One or more directives are identified from the high-level description of the system to (1) transform a portion of the system with a specific technique, (2) build a spatial layout for the system by dividing the system according to functionalities, and (3) specialize the system in response to the spatial layout. The intermediate representation of the system is modified in response to the one or more directives.

In a further embodiment, the method wherein the functional specification for the system describes a sequentially nested loop.

In a further embodiment, the method wherein transforming the sequentially nested loop in the system comprises one or more of tiling and re-ordering one or more loops from the sequentially nested loop.

In a further embodiment, the method wherein building the spatial layout by dividing the system according to functionalities comprises assigning production and consumption of data into separate kernels.

In a further embodiment, the method wherein specializing the system comprises one or more of unrolling a loop and buffering data corresponding to one of the kernels.

In a further embodiment, the method further comprising performing one or more target device specific optimizations that include one or more of redundant code removal, dead code removal, and strength reduction.

In a further embodiment, the method wherein the high-level description of the system is at a higher level of abstraction than a high-level synthesis language.

In a further embodiment, the method wherein the modifying is performed by a compiler prior to performing high-level synthesis.

In a further embodiment, the method further comprising generating a description of the system in a high-level synthesis language from the modified intermediate representation.

In a further embodiment, the method further comprising generating a description of the system in a hardware description language from the modified intermediate representation.

In a further embodiment, a non-transitory computer-readable medium having sequences of instructions, the sequences of instructions including instructions which, when executed, causes a processor to perform the method of any one of the previously described embodiments.

In a further embodiment, an apparatus comprising means to perform a method as claimed in any one of the previously described embodiments.

In another embodiment a method for designing a system on a target device includes generating an intermediate representation of the system from a functional specification in a high-level description of the system that is at a higher level of abstraction than high-level synthesis language. One or more directives to improve the system are identified from the high-level description of the system. The intermediate representation of the system is modified in response to the one or more directives prior to performing high-level synthesis.

In a further embodiment, the method further comprising generating a description of the system in a high-level synthesis language from the modified intermediate representation of the system.

In a further embodiment, the method further comprising generating a description of the system in a hardware description language from the modified intermediate representation of the system.

In a further embodiment, the method wherein the directives specify a transformation to a portion of the system.

In a further embodiment, the method wherein the directives build a spatial layout for the system by dividing the system according to its functionalities.

In a further embodiment, the method wherein the directives specialize the system in response to the spatial layout.

In a further embodiment, the method wherein the functional specification for the system describes a sequentially nested loop.

In a further embodiment, a non-transitory computer-readable medium having sequences of instructions, the sequences of instructions including instructions which, when executed, causes a processor to perform the method of any one of the previously described embodiments.

In a further embodiment, an apparatus comprising means to perform a method as claimed in any one of the previously described embodiments.

In another embodiment, a method for designing a system on a target device includes compiling a specification that describes a first portion of the system without describing a second portion of the system, according to directives in the specification that provide optimization instructions, to generate a high-level synthesis language description of the first portion of the system, wherein the specification is at a level of abstraction higher than the high-level synthesis language. The high-level synthesis language description of the first portion of the system is compiled with a high-level synthesis language description of the second portion of a system to generate a hardware description language of the first portion and the second portion of the system.

In a further embodiment, the method wherein the first portion of the system includes a function with a sequentially nested loop.

In a further embodiment, the method wherein the second portion of the system does not include a function with a sequentially nested loop.

In a further embodiment, the method wherein the directives in the specification requires transforming a sequentially nested loop by performing at least one of tiling and re-ordering.

In a further embodiment, the method wherein the directives in the specification requires building a spatial layout for the system by assigning production and consumption of data into separate kernels.

In a further embodiment, the method wherein the method further comprises compiling the hardware description language of the first portion and the second portion of the system by performing synthesis, placement, and routing of the first portion and the second portion of the system.

In a further embodiment, a non-transitory computer-readable medium having sequences of instructions, the sequences of instructions including instructions which, when executed, causes a processor to perform the method of any one of the previously described embodiments.

In a further embodiment, an apparatus comprising means to perform a method as claimed in any one of the previously described embodiments.

In another embodiment, a system designer includes an intermediate representation unit that generates an intermediate representation of the system from a functional specification in a high-level description of the system that is at a higher level of abstraction than high-level synthesis language. The system designer also includes a transformation unit that identifies one or more directives to improve the system from the high-level description of the system, and modifies the intermediate representation of the system in response to the one or more directives prior to performing high-level synthesis.

In a further embodiment, the system designer further comprises a description generation unit that generates a description of the system in a high-level synthesis language from the modified intermediate representation of the system.

In the foregoing specification, embodiments of the disclosure have been described with reference to specific exemplary embodiments thereof. It will, however, be evident that various modifications and changes may be made thereto without departing from the broader spirit and scope of the embodiments of the disclosure. The specification and drawings are, accordingly, to be regarded in an illustrative rather than restrictive sense.

What is claimed is:

1. A method for designing a system on a target device, comprising:
   generating an intermediate representation of the system from a functional specification of a high-level description of a system;
   identifying from the high-level description of the system one or more directives to (1) transform a portion of the system with a specific technique, (2) build a spatial layout for the system according to compute partitioning directives that partition producers or consumers of data by splitting the intermediate representation of the system into a plurality of connected components based on a producer-consumer relationship and comprising assigning production and consumption of data into separate kernels, and (3) specialize the system in response to the spatial layout; and
   modifying the intermediate representation of the system in response to the one or more directives to generate a modified intermediate representation.

2. The method of claim 1, wherein the functional specification for the system describes a sequentially nested loop.

3. The method of claim 2, wherein transforming the sequentially nested loop in the system comprises one or more of tiling and re-ordering one or more loops from the sequentially nested loop.

4. The method of claim 2, wherein transforming the sequentially nested loop in the system comprises one or more of unrolling, vectorization, and loop removal from the sequentially nested loop.

5. The method of claim 2, wherein specializing the system comprises one or more of unrolling a loop and buffering data corresponding to one of the kernels.

6. The method of claim 1 further comprising performing one or more target device specific optimizations that include one or more of redundant code removal, dead code removal, and strength reduction.

7. The method of claim 1, wherein the high-level description of the system is at a higher level of abstraction than a high-level synthesis language.

8. The method of claim 1, wherein the modifying is performed by a compiler prior to performing high-level synthesis.

9. The method of claim 1 further comprising generating a description of the system in a high-level synthesis language from the modified intermediate representation.

10. The method of claim 1 further comprising generating a description of the system in a hardware description language from the modified intermediate representation.

11. A method for designing a system on a target device, comprising:
    generating an intermediate representation of the system from a functional specification in a high-level description of the system that is at a higher level of abstraction than a high-level synthesis language;
    identifying from the high-level description of the system one or more directives to improve the system, wherein the one or more directives build a spatial layout for the system according to compute partitioning directives that partition producers or consumers of data by splitting the intermediate representation of the system into a plurality of connected components based on a producer-consumer relationship and by assigning production and consumption of data into separate kernels; and
    modifying the intermediate representation of the system in response to the one or more directives prior to performing high-level synthesis to generate a modified intermediate representation.

12. The method of claim 11 further comprising generating a description of the system in the high-level synthesis language from the modified intermediate representation of the system.

13. The method of claim 11 further comprising generating a description of the system in a hardware description language from the modified intermediate representation of the system.

14. The method of claim 11, wherein the directives specify a transformation to a portion of the system.

15. The method of claim 11, further comprising performing one or more target device specific optimizations that include one or more of redundant code removal, dead code removal, and strength reduction.

16. The method of claim 11, wherein the directives specialize the system in response to the spatial layout.

17. The method of claim 11, wherein the functional specification for the system describes a sequentially nested loop.

18. A non-transitory computer readable medium including a sequence of instructions stored thereon for causing a computer to execute a method for designing a system on a target device, comprising:
    compiling a specification that describes a first portion of the system without describing a second portion of the system, according to directives in the specification that provide optimization instructions, wherein the directives in the specification require building a spatial layout for the system according to compute partitioning directives that partition producers or consumers of data by splitting an intermediate representation of the system into a plurality of connected components based on a producer-consumer relationship and by assigning production and consumption of data into separate kernels, to generate a high-level synthesis language description of the first portion of the system, wherein the specification is at a level of abstraction higher than a high-level synthesis language; and compiling the high-level synthesis language description of the first portion of the system with a high-level synthesis language description of the second portion of the system to generate a hardware description language of the first portion and the second portion of the system.

19. The non-transitory computer readable medium of claim 18, wherein the first portion of the system includes a function with a sequentially nested loop.

20. The non-transitory computer readable medium of claim 19, wherein the second portion of the system does not include a function with a sequentially nested loop.

21. The non-transitory computer readable medium of claim 18, wherein the directives in the specification require transforming a sequentially nested loop by performing at least one of tiling and re-ordering.

22. The non-transitory computer readable medium of claim 21, wherein transforming the sequentially nested loop in the system comprises one or more of unrolling, vectorization, and loop removal from the sequentially nested loop.

23. The non-transitory computer readable medium of claim 18, wherein the method further comprises compiling the hardware description language of the first portion and the second portion of the system by performing synthesis, placement, and routing of the first portion and the second portion of the system.

24. A system designer, comprising:
an intermediate representation unit that generates an intermediate representation of the system from a functional specification in a high-level description of the system that is at a higher level of abstraction than a high-level synthesis language; and
a transformation unit that identifies one or more directives to improve the system from the high-level description of the system, wherein the one or more directives comprises building a spatial layout for the system according to compute partitioning directives that partition producers or consumers of data by splitting the intermediate representation of the system into a plurality of connected components based on a producer-consumer relationship and by assigning production and consumption of data into separate kernels, and that modifies the intermediate representation of the system in response to the one or more directives prior to performing high-level synthesis to generate a modified intermediate representation.

25. The system designer of claim 24 further comprising a description generation unit that generates a description of the system in the high-level synthesis language from the modified intermediate representation of the system.

* * * * *